(12) United States Patent
Marti et al.

(10) Patent No.: US 7,824,231 B2
(45) Date of Patent: Nov. 2, 2010

(54) INTERNAL CROSSTALK COMPENSATION CIRCUIT FORMED ON A FLEXIBLE PRINTED CIRCUIT BOARD POSITIONED WITHIN A COMMUNICATIONS OUTLET, AND METHODS AND SYSTEM RELATING TO SAME

(75) Inventors: Franklin C. Marti, Clinton, WA (US); Jason Erickson, Bothell, WA (US); Jeffrey P. Seefried, Lake Stevens, WA (US)

(73) Assignee: Leviton Manufacturing Co., Inc., Melville, NY (US)

( * ) Notice: Subject to any disclaimer, the term of this patent is extended or adjusted under 35 U.S.C. 154(b) by 190 days.

(21) Appl. No.: 12/234,597

(22) Filed: Sep. 19, 2008

(65) Prior Publication Data

US 2009/0104821 A1 Apr. 23, 2009

Related U.S. Application Data

(60) Provisional application No. 60/973,675, filed on Sep. 19, 2007.

(51) Int. Cl.
*H01R 24/00* (2006.01)
(52) U.S. Cl. ........................... 439/676; 439/949
(58) Field of Classification Search ................ 439/676, 439/949
See application file for complete search history.

(56) References Cited

U.S. PATENT DOCUMENTS

| | | | |
|---|---|---|---|
| 5,186,647 A | 2/1993 | Denkmann et al. | |
| 5,299,956 A | 4/1994 | Brownell et al. | |
| 5,791,943 A | 8/1998 | Lo et al. | |
| 6,083,052 A | 7/2000 | Adams et al. | |
| 6,139,371 A | 10/2000 | Troutman et al. | |

(Continued)

FOREIGN PATENT DOCUMENTS

JP 2000113941 A 4/2000

OTHER PUBLICATIONS

U.S. Appl. No. 12/604,207, filed Oct. 22, 2009, Applicants: Franklin C. Marti et al.

(Continued)

*Primary Examiner*—James Harvey
(74) *Attorney, Agent, or Firm*—Kathryn M. Milam; Paul F. Rusyn; Graybeal Jackson LLP

(57) ABSTRACT

A communications outlet includes eight outlet tines positioned adjacent to one another and define four pairs of outlet tines. The fourth and fifth outlet tines define a first pair, the first and second outlet tines define a second pair, the third and sixth outlet tines define a third pair, and the seventh and eighth outlet tines define a fourth pair. Each outlet tine has a free end near which a plug tine is adapted to contact the outlet tine and each outlet tine has a fixed end coupled through a corresponding conductive tine to a corresponding electrical contact. The communications outlet includes an internal crosstalk compensation stage having a plurality of conductive fingers. Each conductive finger is physically connected to a corresponding one of the outlet tines proximate the free ends of the tines. The internal crosstalk compensation stage is operable to provide positive compensation for internal crosstalk between pairs corresponding to the tines to which the conductive fingers of the flexible printed circuit board are attached.

20 Claims, 10 Drawing Sheets

U.S. PATENT DOCUMENTS

| | | | |
|---|---|---|---|
| 6,186,834 B1 | 2/2001 | Arnett et al. | |
| 6,379,157 B1 | 4/2002 | Curry et al. | |
| 6,464,541 B1 | 10/2002 | Hashim et al. | |
| 6,641,443 B1 | 11/2003 | Itano et al. | |
| 6,786,776 B2 | 9/2004 | Itano et al. | |
| 7,038,554 B2 | 5/2006 | Seefried | |
| 7,153,168 B2 | 12/2006 | Caveney et al. | |
| 7,179,131 B2 | 2/2007 | Caveney et al. | |
| 7,201,618 B2 | 4/2007 | Ellis et al. | |
| 7,204,722 B2 | 4/2007 | Hashim et al. | |
| 7,273,396 B2 | 9/2007 | Itano et al. | |
| 7,281,957 B2 | 10/2007 | Caveney | |
| 7,309,261 B2 | 12/2007 | Caveney et al. | |
| 7,357,683 B2 | 4/2008 | Caveney et al. | |
| 7,381,098 B2 | 6/2008 | Hammond, Jr. et al. | |
| 7,384,315 B2 | 6/2008 | Caveney et al. | |
| 7,736,195 B1* | 6/2010 | Poulsen et al. | 439/676 |
| 2006/0189215 A1 | 8/2006 | Ellis et al. | |
| 2007/0173120 A1 | 7/2007 | Caveney et al. | |
| 2007/0270042 A1 | 11/2007 | Belopolsky et al. | |
| 2007/0270044 A1 | 11/2007 | Belopolsky et al. | |
| 2008/0045090 A1 | 2/2008 | Caveney | |
| 2009/0104821 A1* | 4/2009 | Marti et al. | 439/676 |
| 2009/0163084 A1 | 6/2009 | Straka et al. | |
| 2010/0041278 A1* | 2/2010 | Bopp et al. | 439/676 |

OTHER PUBLICATIONS

Korean Intellectual Property Office (ISA), International Search Report, International Application No. PCT/US2008/077138, Mar. 23, 2009.

Korean Intellectual Property Office (ISA), Written Opinion, International Application No. PCT/US2008/077138, Mar. 23, 2009.

U.S. Appl. No. 12/401,587, filed Mar. 10, 2003; Inventors: Jeffrey Alan Poulsen, Jason Erickson, Jeffrey Seffried.

* cited by examiner

INTERNAL CROSSTALK COMPENSATION CIRCUIT FORMED ON A FLEXIBLE PRINTED CIRCUIT BOARD POSITIONED WITHIN A COMMUNICATIONS OUTLET, AND METHODS AND SYSTEM RELATING TO SAME

PRIORITY CLAIM

This application claims the benefit of U.S. Provisional Patent Application No. 60/973,675, filed Sep. 19, 2007, which application is incorporated herein by reference in its entirety.

TECHNICAL FIELD

The present invention relates generally to communications jacks or outlets and, more specifically, to circuits and methods for reducing internal crosstalk in communications outlets.

BACKGROUND

The speed of data communications networks has been increasing steadily and substantially over the past several decades, requiring newly designed components to enable the networks to operate at these new higher speeds. As the speed of networks increase, the frequency at which electrical signals in these networks are communicated increases, and physical wiring paths within the networks, which presented no problems at lower frequencies, can effectively become antennae that broadcast and receive electromagnetic radiation and cause errors in the data being communicated. This unwanted coupling of signals from one communication path or channel in a network to another channel, or among signal paths within a given channel, is known as "crosstalk" and degrades the overall performance of the network. Unwanted crosstalk can occur between any proximate electrically conductive paths that physically form parts of the network such as cables that carry the data signals and even within connectors used to connect cables to desired electronic components such as routers and network switches.

FIG. 1 is a diagram illustrating a portion of a conventional communications network 100 including a typical communications channel 101. The channel 101 includes a communications jack or outlet 102 into which a communications plug 104 of a cable 106 is inserted to thereby connect a computer system 108 to the communications network 100. The communications outlet 102 fits within an opening 110 of a wall plate 112 to expose an aperture 114 in the communications outlet into which the plug 104 is inserted. Electrical signals are then communicated to and from the computer system 108 through the cable 106, plug 104, outlet 102, and a cable 116. The cable 116 includes another communications outlet 118 on the other end of the cable, with this communications outlet which is often part of another network component such as a patch panel 120. A network switch 122 or other network component is connected to the outlet 118 through a cable 124 and plug 126 and interconnects the communications channel 101 to other components (not shown) within the network 100. The network 100 may, of course, include a large number of communications channels 101, as will be appreciated by those skilled in the art.

The cables 106 and 116, plugs 104 and 126, and outlets 102 and 118 are standardized components that include specified numbers of conductors and provide compatibility of new components, such as a new computer system 108, with the network 100. Standards organizations specify performance standards by which the outlet 102 and other components are categorized. Outlets meeting categories CAT6 and CAT6A performance standards, for example, must be capable of carrying signals in the 1 to 250 MHz and 1 to 500 MHz, respectively, frequency range. Unfortunately, typical outlets 102, 118 and plugs 104, 126 include up to eight wires or conductors, such as in RJ-45 outlets and plugs, that are spaced closely together within the outlets and plugs. This is illustrated in FIG. 2 which is a more detailed perspective view of the communications outlet 102 of FIG. 1. The outlet 102 includes an insulating housing or body 200 and a plurality of resilient conductive outlet tines T in parallel arrangement within an interior receptacle 202 of the body. The receptacle 202 is formed in a front 204 of the body 200 and the outlet tines T within the receptacle are connected to insulation displacement connectors (IDCs) 206 (not shown) situated within termination block 210 at a back 208 of the body. Wires within the cable 116 of communications channel 101 (FIG. 1) are then connected to the IDCs 206.

FIG. 3 is a perspective view of the communications outlet 102 of FIG. 2 with the body 200 removed to better illustrate the resilient conductive outlet tines T and other components within the outlet. The outlet 102 includes a printed circuit board 300 positioned near the back 208 of the outlet. The IDCs 206 are attached to the printed circuit board 300 and each of the tines T includes a fixed end 302 that is also attached to the printed circuit board. Conductive traces 304 on the printed circuit board 300, only one of which is shown to simplify the figure, interconnect the IDCs 206 and fixed ends 302 of the tines T. The tines T include free ends 306 positioned proximate the front 204 of the outlet 102. The outlet 102 further includes nonconductive and resilient spring arms 308 that function to support the tines T.

Due to the close spacing of the tines T within the outlet 102, the frequency of signals being communicated increases in high speed networks such as 10 Gigabit or "10 G" networks like 10 G Ethernet networks (10 GigE). In these networks, increased crosstalk can occur among the tines T within the outlet 102 and among corresponding tines (not shown) within the plugs 104, 126 (FIG. 1). FIG. 4 is a schematic of the outlet 102 of FIGS. 1-3 and illustrates eight conductors C1-C8 contained in the outlet. Each of the eight conductors C1-C8 represents the corresponding conductive outlet tine T, conductive traces 304 on the rigid printed circuit board 300, and IDC 206. Thus, in FIG. 4 portions of the conductors C1-C8 on the left side of the figure correspond to the outlet tines T in the outlet 102 (FIG. 3) that extend from the free ends 306 of outlet tines T to the fixed ends 302 of outlet tines T (FIG. 3). The portion of conductors C1-C8 on the right side represent the conductive traces 304 and IDCs 206 that are situated at the back 208 (FIG. 3) of the outlet 102.

The eight conductors C1-C8 form four signal pairs P1-P4, with conductors C4 and C5 being pair P1, conductors C1 and C2 being pair P2, conductors C7 and C8 being pair P4, and conductors C3 and C6 being pair P3. Each pair P1-P4 of conductors C1-C8 carries a corresponding electrical signal, as will be appreciated by those skilled in the art.

As shown in FIG. 4, the conductors C1 and C2 of pair P2, C4 and C5 of pair P1, and conductors C7 and C8 of pair P4 "crossover" towards the front 204 to reduce internal crosstalk within the outlet 102. These crossovers help reduce internal crosstalk among the pairs P1-P4 within an individual communications channel 101 (FIG. 1). The term "internal crosstalk" is used to mean crosstalk that occurs among the pairs P1-P4 of conductors C1-C8 within an individual or single communications channel 101 (FIG. 1). Internal crosstalk is thus the unwanted effect of a signal being communicated on one conductor C or pair P on the signals being communicated on another conductor C or pair P within the outlet 102. The fact that such internal crosstalk presents problems at higher frequencies is well known to those skilled in the art. In particular, the close spacing of conductive plates and conductor routing within plug 104 (FIG. 1), the close spacing of the outlet tines T and the asymmetrical electrical exposure of conductors C3 and C6 of pair P3 to the conductors of pairs P1, P2, P4 are all significant causes of increased internal crosstalk at the higher frequencies of transmission required for current communications outlets. For example, conductors C7 and C8 of pair P4 are affected more by the signal on the conductor C6 due to the small physical separation between these conductors. Conversely, conductors C1 and C2 of pair P2 are affected more by the signal on the conductor C3, once again due to the small physical separation between these conductors. Due to the separation or "splitting" of the conductors C3 and C6 of pair P3, this pair of conductors is commonly referred to as the "split pair." The split pair configuration of P3 is historical and current outlets maintain this configuration for compatibility reasons.

There is a need for an improved communications outlet having reduced susceptibility to internal crosstalk without significantly increasing the expense and the complexity of manufacturing the outlet.

SUMMARY

According to one aspect of the present invention, a communications outlet includes eight outlet tines positioned adjacent to one another and configured as four pairs of two outlet tines for each pair. The fourth and fifth outlet tines define a first pair, the first and second outlet tines define a second pair, the third and sixth outlet tines define a third pair, and the seventh and eighth outlet tines define a fourth pair. Each outlet tine has a free end near which a plug tine is adapted to contact the outlet tine. Each outlet tine also has a fixed end coupled through a corresponding conductive tine to a corresponding external connector. The communications outlet includes an internal crosstalk compensation stage comprised of a flexible printed circuit board having a plurality of conductive fingers. Each conductive finger is physically connected to a corresponding one of the outlet tines proximate the free ends of the tines. The internal crosstalk compensation stage is operable to provide positive compensation for internal crosstalk between pairs corresponding to the tines to which the conductive fingers of the flexible printed circuit board are connected.

DETAILED DESCRIPTION

Figure 5:
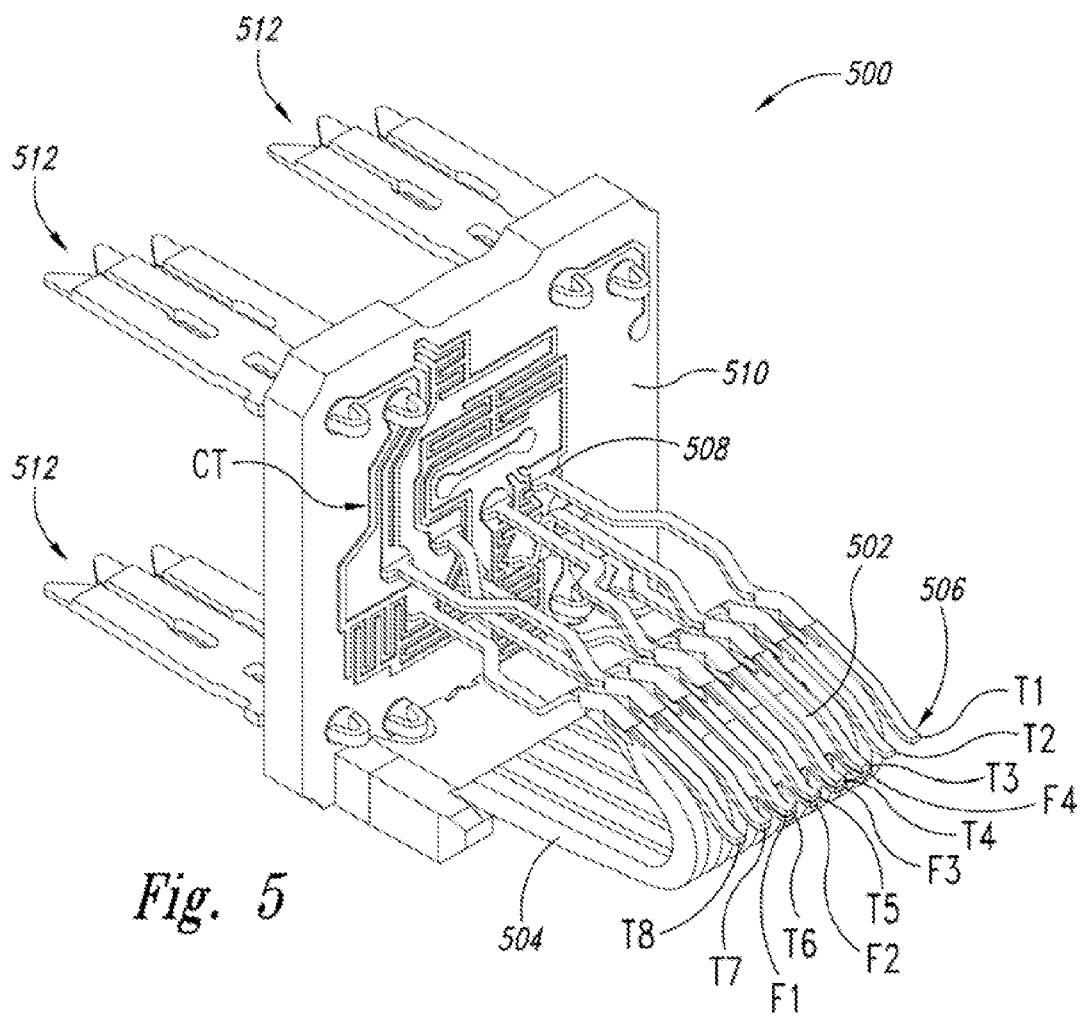
FIG. 5 is a perspective view of a communications outlet including a flexible printed circuit board attached to the resilient conductive outlet tines to reduce the susceptibility of the outlet to internal crosstalk according to one embodiment of the present invention.

FIG. 5 is a perspective view of a communications outlet 500 including a flexible printed circuit board 502 attached to resilient conductive outlet tines T1-T8 to reduce the susceptibility of the communications outlet to internal crosstalk according to one embodiment of the present invention. In the embodiment of FIG. 5, the flexible printed circuit board 502 is physically attached to the tines T3-T6 very near contact points (not shown) where tines of a plug (not shown) inserted in the outlet 500 contact the tines T1-T8. In operation, the flexible printed circuit board 502 provides positive compensation between pair P1 (tines T4, T5) and pair P3 (tines T3, T6) which thereby cancels or compensates for a significant amount of internal crosstalk within the outlet 500 such that the outlet meets crosstalk requirements of 10 G networks as will be explained in more detail below. The term "positive compensation" will also be defined and explained in more detail below. The physical location of the flexible printed circuit board 502 provides a space saving solution to supplying the required positive compensation. The board 502 also provides desirable mechanical support for the tines T3-T6 which, in turn, provides even spacing of these tines and eliminates the need for combs or other components to ensure proper spacing. The location of the board 502 also allows the board to be installed by a machine during formation of the outlet 500 and does not require hand installation.

In the present description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention. Also note that in the present description where more than one of a given component exists, the components are typically referred to using a reference letter followed by a reference number, such as the tines T1-T8. When referring to a specific one or ones of the components both the reference letter and reference number will be utilized (e.g., T1, T7) while only the reference letter will be utilized when referring to all or any of the components.

Figure 4:
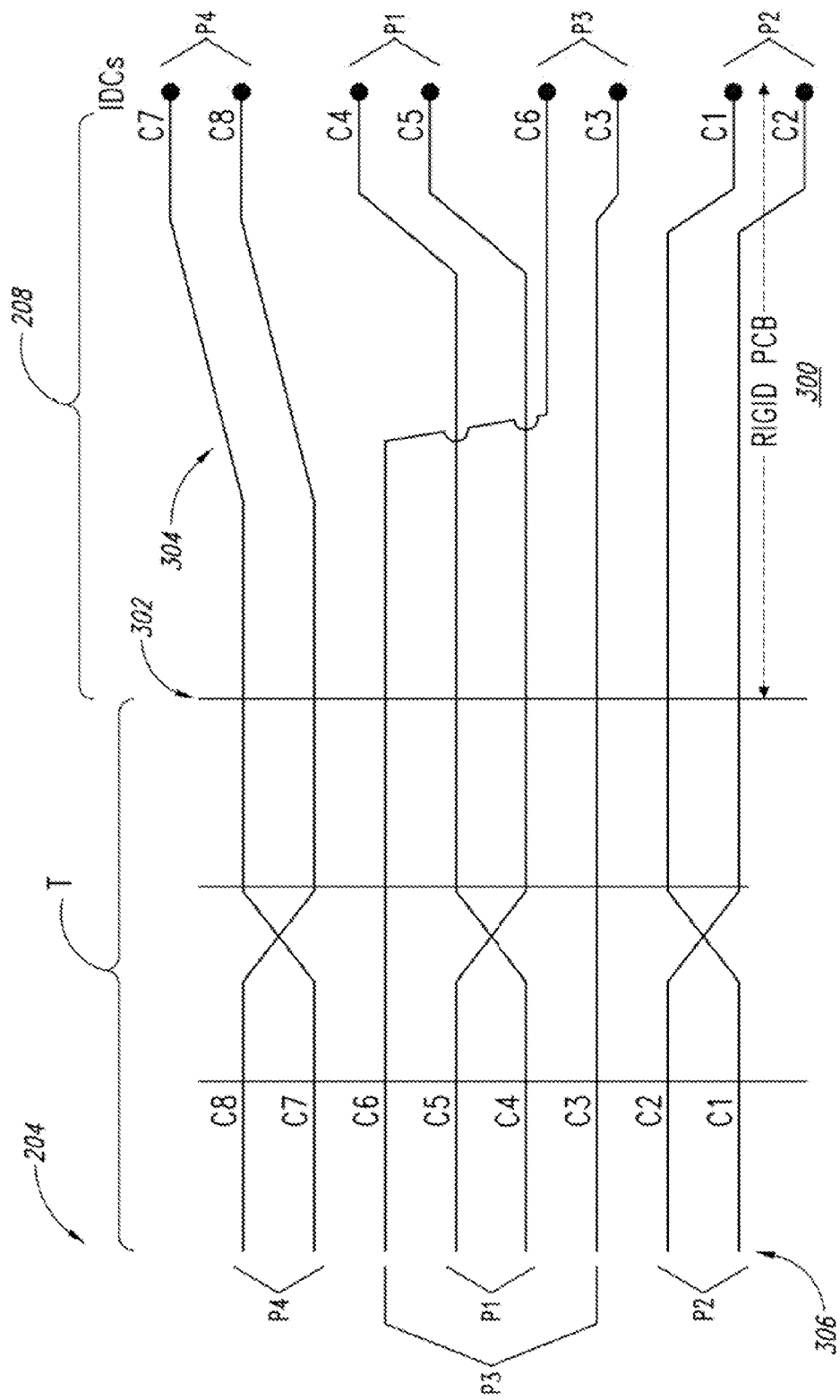
FIG. 4 is a schematic of the communications outlet of FIGS. 1-3 that illustrates the eight conductors including the resilient conductive outlet tines contained in the communications outlet.

The flexible printed circuit board 502 is physically positioned underneath the tines T and above the spring arms 504 that function to support the tines. Each of the tines T1-T8 includes a corresponding free end 506 and fixed end 508 that is attached to a rigid printed circuit board 510. The fixed end 508 of each tine T is electrically connected through conductive traces CT on the rigid circuit board 510 to a corresponding conductive contact 512 such as an insulation displacement connector (IDC). The electrical contact 512 will be referred to as an IDC in the present description by way of example, although other suitable contacts could also be utilized, such as terminals, bonding pads, vias or through holes, and so on, as will be appreciated by those skilled in the art. In the example embodiment of FIG. 5, the rigid printed circuit board 510 also includes conductive traces CT that form capacitances among selected ones of the tines T and provide additional compensation for internal crosstalk, as will be described in more detail below. In the same way as previously discussed with reference to FIG. 4, the outlet 500 includes eight conductors C1-C8 (not designated in FIG. 5), each conductor including the corresponding conductive outlet tine T, conductive trace CT on the printed circuit board 510 and IDC 512.

Figure 6:
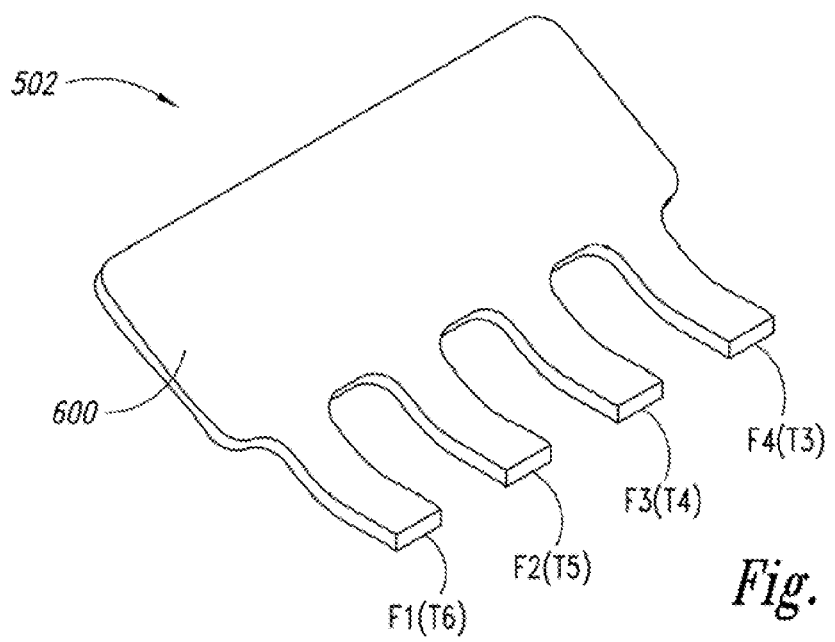
FIG. 6 is a perspective view illustrating in more detail the flexible printed circuit board of FIG. 5 according to one embodiment of the present invention.

FIG. 6 is a perspective view illustrating in more detail the flexible printed circuit board 502 of FIG. 5 according to one embodiment of the present invention. The flexible printed circuit board 502 includes a circuit portion 600 on which capacitive components (not shown) are formed to provide the desired positive compensation. The board 502 further includes four conductive fingers F1-F4 that are attached to the tines T6-T3, respectively, with the tine to which each conductive finger is attached being indicated in parentheses next to the descriptor for the conductor (e.g., F4 is connected to tine T3). The fingers F1-F4 are attached to the tines T6-T3 through any of a variety of suitable techniques, such as soldering, spot welding, electrically conductive adhesives, and so on, as will be appreciated by those skilled in the art. Suitable conductive traces (not shown) formed on the circuit portion 600 interconnect the conductive fingers F to the capacitive components (not shown) formed on the circuit portion and thereby interconnect the capacitive components to the desired tines T, as will be described in more detail below.

Figure 7:
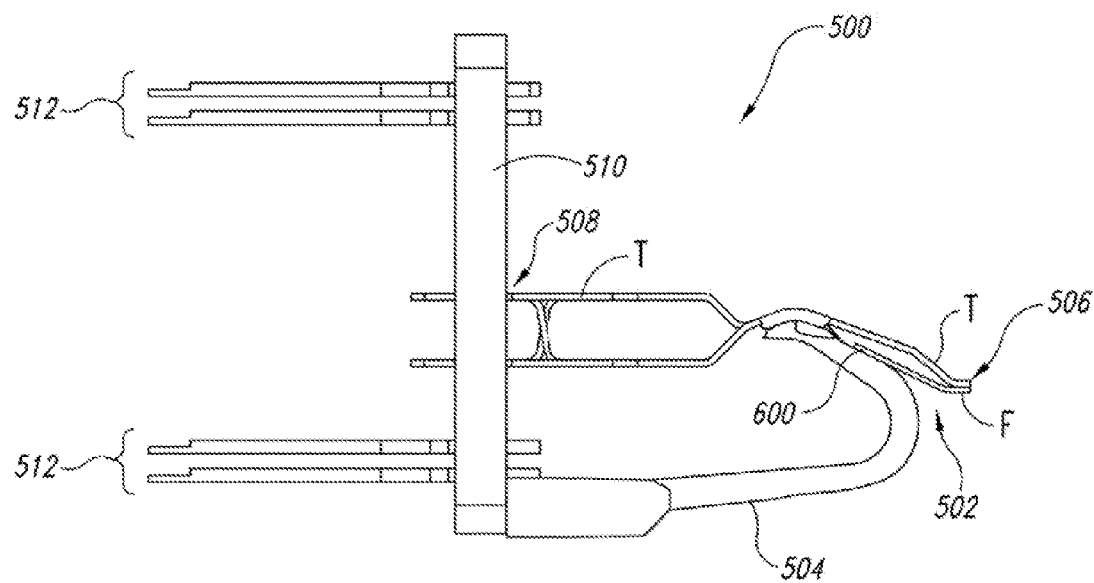
FIG. 7 is a cross sectional view of the communications outlet of FIG. 5 better illustrating the position of the flexible printed circuit board between the resilient conductive outlet tines and the spring arms.

FIG. 7 is a cross sectional view of the communications outlet 500 of FIG. 5 better illustrating the position of the flexible printed circuit board 502 between the resilient conductive outlet tines T and the spring arms 504. As illustrated in the figure, the fingers F of the flexible printed circuit board 502 are attached to the tines T proximate the free ends 506 of the tines. When the flexible printed circuit board 502 is attached in place within the outlet 500 as shown, the ends of the fingers F are bent where the fingers are attached to the tines and a bottom surface of the circuit portion 600 rests against the spring arms 504. The spring arms 504 are nonconductive. Thus, the contact of the spring arms with the bottom surface of the circuit portion 600, and capacitive components thereon (not shown), do not interfere with the proper operation of these capacitive components. Moreover, the circuit portion 600 of the flexible printed circuit board 502 may be coated with a suitable dielectric to prevent contact, such as between the resilient conductive outlet tines T and the upper surface of the circuit portion 600, from interfering with the proper operation of the printed circuit board.

Figure 8:
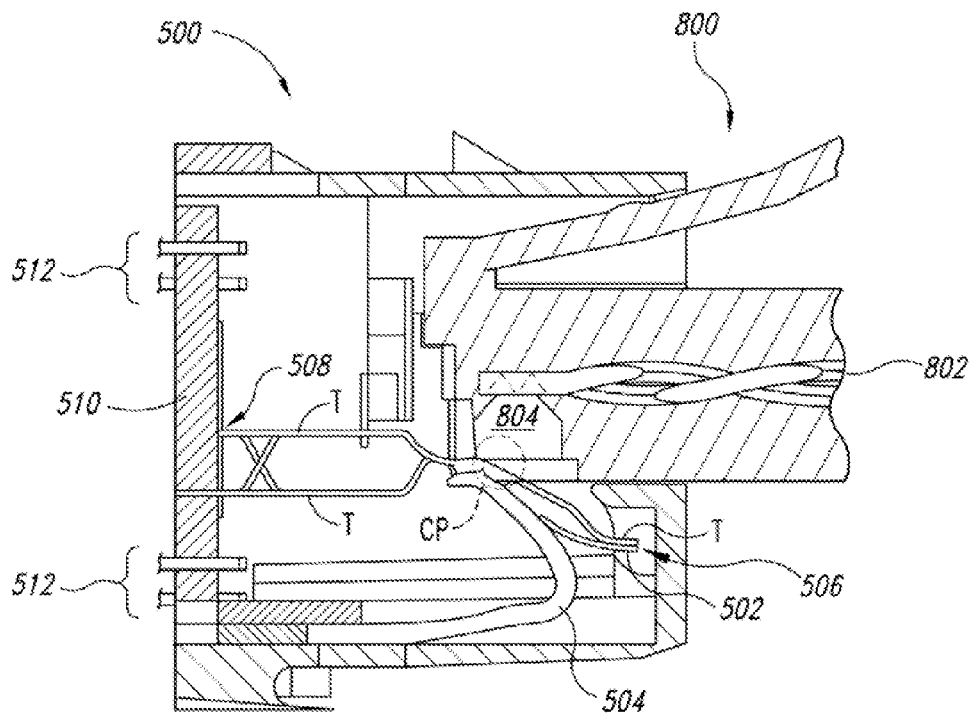
FIG. 8 is a cross sectional view of the communications outlet of FIG. 5 when a plug is inserted in the communications outlet.

FIG. 8 is a cross sectional view of the communications outlet 500 of FIG. 5 when a plug 800 is inserted in the communications outlet. The plug 800 includes eight conductors 802, each of the conductors transmitting a signal on a corresponding one of the tines T in the communications outlet 500. When inserted in the communications outlet 500, the plug 800 includes a plurality of conductive contacts 804. Each of the conductive contacts 804 is connected to a corresponding one of the conductors 802 and, when the plug 800 is inserted in the outlet 500, each contact 804 touches a corresponding one of the tines T at a contact point CP. As seen in the figure, the flexible printed circuit board 502 is attached to the tines T proximate the free ends 506 of the tines, which is some distance from the contact points CP at which the contacts 804 of the plug 800 contact the tines T. From a purely electrical standpoint, to cancel internal crosstalk present on the conductors 802 of the plug 800, the desired compensation should be placed as close to the contact points CP as possible. In outlet 500, however, a balance between the performance of the flexible printed circuit board 502 and the manufacturability of the outlet is achieved. More specifically, positioning the flexible printed circuit board 502 as illustrated in the embodiment of FIG. 8 allows for easier manufacture of the outlet 500 while also providing sufficient compensation for internal crosstalk to enable the outlet to be utilized in 10 G applications.

Figure 9A:
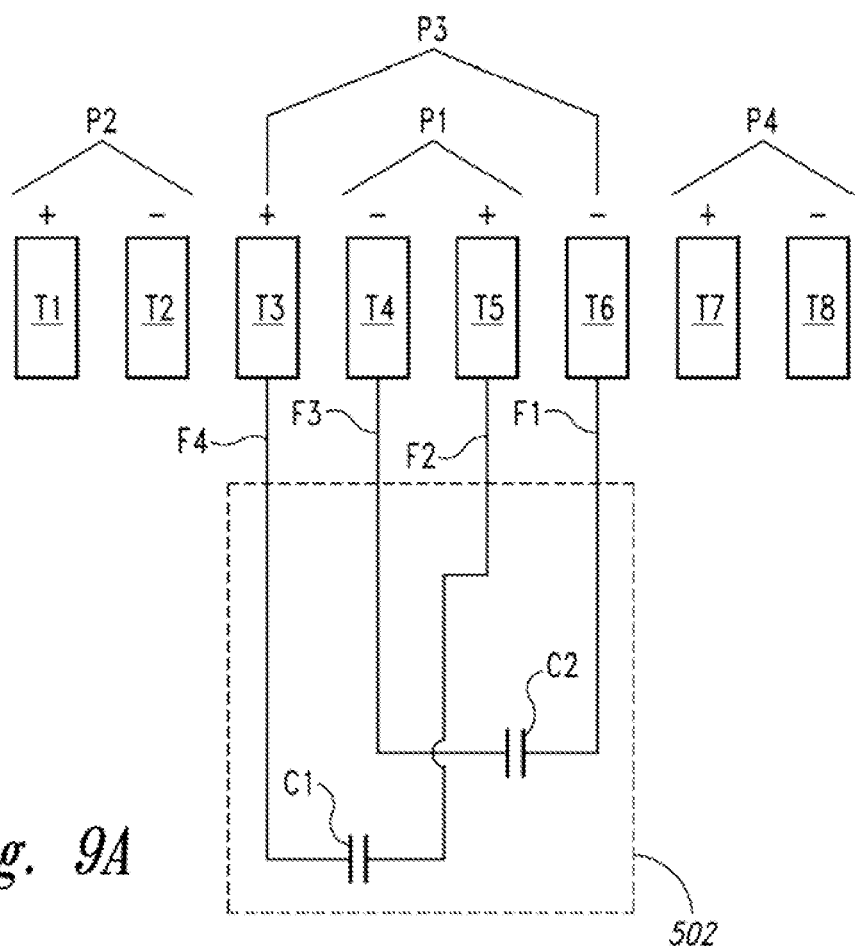
FIG. 9A is a schematic illustrating capacitive components formed on the flexible printed circuit board of FIGS. 5-8 according to one embodiment of the present invention.

FIG. 9A is a schematic illustrating capacitive components C1 and C2 formed on the circuit portion 600 of the flexible printed circuit board 502 of FIGS. 5-8 according to one embodiment of the present invention. The capacitive component C1 is connected between finger F4 and finger F2 of the board 502 and thus between tines T3 and T5. Similarly, the capacitive component C2 is connected between fingers F3 and F1 of the board 502 and is thereby connected between tines T4 and T6. As previously mentioned, the capacitive components C1 and C2 on the flexible printed circuit board 502 provide positive compensation to reduce internal crosstalk between pairs P1 and P3. Each tine T in each pair P is considered as carrying either a positive signal or a negative signal relative to the signals on the tines of the other pairs P in the outlet 500. For example, in the pair P3 the tine T3 is considered as carrying a positive signal and the tine T6 is considered as carrying a negative signal. Similarly, in the pair P1 the tine T4 is considered as carrying a negative signal and the tine T5 as carrying a positive signal. The designation of each tine T as carrying either a positive or negative signal is indicated in FIG. 9 through either a "+" or a "−" placed adjacent to each tine. Positive compensation is thus defined as coupling a positive signal of a first pair P to the positive signal of a second pair and the negative signal of the first pair to the negative signal of the second pair. Conversely, negative compensation is defined as coupling the positive signal of a first pair P to the negative signal of a second pair and the negative signal of the first pair to the positive signal of the second pair. In pair P1, tine T4 is considered as carrying a negative signal and tine T5 as carrying a positive signal. In pair P3, the tine T6 is considered as carrying a negative signal and the tine T3 as carrying a positive signal. As a result, when the signals of pairs P1 and P3 are defined in this way, the flexible printed circuit board 502 of FIG. 9 provides positive compensation as this term has been defined. This is true because the positive signal on tine T5 is coupled via capacitive component C1 to the positive signal on tine T3 and the negative signal on tine T6 is coupled via capacitive component C2 to the negative signal on tine T4.

Figure 9B:
FIG. 9B is a cross sectional exploded view of one of the capacitors of FIG. 9 as that capacitor is physically constructed on the flexible printed circuit board of FIG. 6 according to one embodiment of the present invention.
Figure 9C:
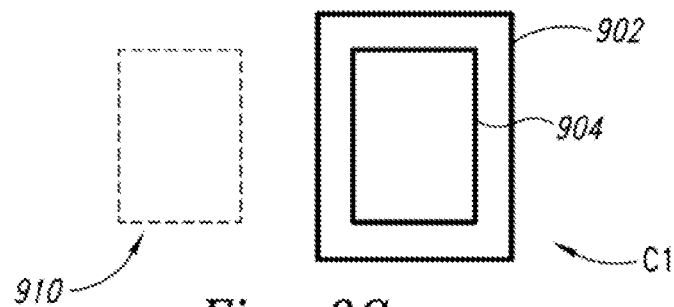
FIG. 9C is a bottom view of the capacitor of FIG. 9B illustrating the different sizes of the top and bottom conductive plates of this capacitor according to one embodiment of the present invention.

FIG. 9B is a cross sectional exploded view of one of the capacitors C1, C2 of FIG. 9 as that capacitor is physically constructed on the flexible printed circuit board 502 of FIG. 6 according to one embodiment of the present invention. The illustrated capacitor will be referred to as C1 in the following description. The capacitor C1 includes a dielectric layer 900 positioned between a larger conductive top plate 902 and a smaller conductive bottom plate 904. A suitable insulating layer 906 covers the top plate 902 and an insulating layer 908 covers the bottom plate 904. In the embodiment of FIG. 9B, notice that the top plate 902 is larger than the bottom plate 904. Making the two plates 902 and 904 different sizes reduces unwanted variations of the capacitance value of C1 that can arise due to errors in alignment between the two plates during manufacturing. These errors are typically referred to as registration errors and will now be described in more detail with reference to FIG. 9C.

FIG. 9C is a bottom view of the capacitor C1 of FIG. 9B illustrating the different sizes of the top and bottom plates 902, 904. The bottom plate 904 is shown aligned in the center of the larger top plate 902 as would ideally be the case. Due to registration errors during manufacture, however, the alignment of the two plates 902 and 904 may not be ideal as illustrated. By making the top plate 902 larger than the bottom plate 904, the effects of registration errors are reduced because even if the smaller bottom plate is offset from the center of the top plate, the bottom plate is still more likely to completely overlap the larger top plate. The overlap of the two plates 902 and 904 is one factor that determines the value of the capacitor C1. If not properly aligned, the capacitor C1 may not have the required value to provide the desired internal crosstalk compensation. For example, an extreme example is illustrated in FIG. 9C in which the bottom plate 904 is shown at a position 910 where the bottom plate does not overlap the top plate 902 at all. In this situation, the capacitor C1 would likely not have the required value to provide the desired internal crosstalk compensation. In the capacitor C1, the larger top plate 902 relative to bottom plate 904 enables the bottom plate to be offset from its ideal center position relative to the top plate due to registration errors while still obtaining the desired value for the capacitor.

Figure 10:
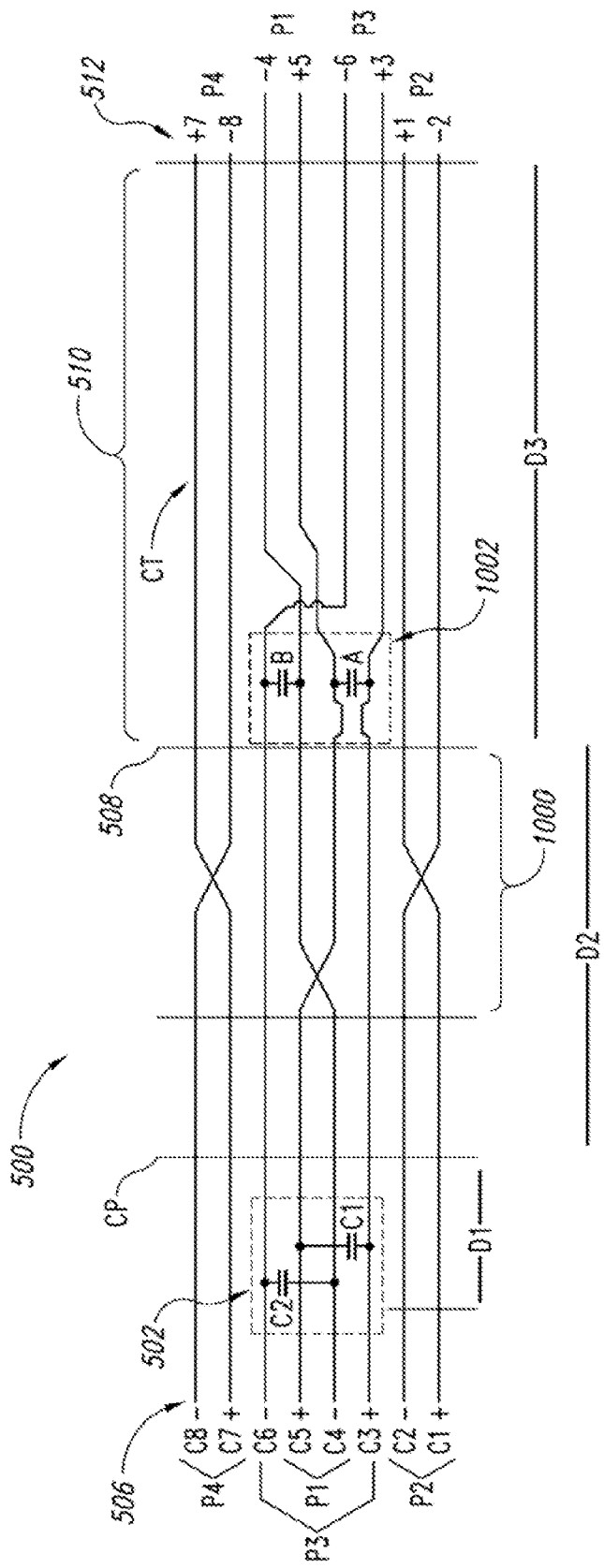
FIG. 10 is a schematic of the communications outlet of FIGS. 5-8 including internal crosstalk compensation for pairs one and three according to one embodiment of the present invention.

FIG. 10 is a schematic of the communications outlet 500 of FIGS. 5-9 including internal crosstalk compensation for pairs P1 and P3 on the flexible printed circuit board 502 according to one embodiment of the present invention. In the embodiment of FIG. 10, the communications outlet 500 includes additional internal crosstalk compensation components formed on the rigid printed circuit board 510, as will now be described in more detail. The outlet 500 includes eight conductors C1-C8, which correspond to the conductive outlet tines T1-T8 on the left side of the figure and to conductive traces CT on the printed circuit board 510 and IDCs 512 on the right side of the figure. Thus, each conductor C1-C8 includes the corresponding outlet tine T1-T8, conductive trace CT and IDC 512. The free ends 506 of the tines are indicated on the far left of the figure and the flexible printed circuit board 502 is shown proximate these free ends. A first distance D1 defines the distance from the point at which positive compensation is provided, which is the point at which the fingers F of the flexible printed circuit board 502 are attached to the tines T3-T6 proximate to the contact points CP at which the contacts 804 (FIG. 8) of the plug 800 (FIG. 8) contact the tines.

A second distance D2 defines the distance between the contact points CP and the fixed ends 508 of the tines where the tines are attached to the rigid printed circuit board 510. A portion of the distance D2 is designated a crossover region 1000 in which the tines T7 and T8 of pair P4 crossover, the tines T4 and T5 of pair P1 crossover, and the tines T1 and T2 of pair P2 crossover. In the embodiment of FIG. 10, the outlet 500 includes a second positive internal crosstalk compensation stage 1002 formed on the rigid printed circuit board 510 proximate the fixed ends 508 of the tines T. In the example shown, the stage 1002 is formed by a first capacitor A coupled between conductors C3 and C5 and a second capacitor B coupled between conductors C4 and C6. The stage 1002 is termed a "second" stage since the flexible printed circuit board 502 provides positive internal crosstalk compensation and thus may be considered a first stage of positive internal crosstalk compensation. As previously discussed, the internal crosstalk between pairs P1 and P3 is the most significant crosstalk between any two pairs and the stage 1002 provides electrically delayed positive internal crosstalk compensation for pairs P1 and P3 that reduces the crosstalk of these pairs at 10 G frequencies. The compensation provided by stage 1002 for pairs P1, P3 is electrically delayed relative to the compensation provided for the same pairs by the flexible printed circuit board 502. In FIG. 10, a third distance D3 defines the distance from the fixed ends 508 of the tines T where the tines enter the rigid printed circuit board 510 to the point where the IDCs 512 are attached to the rigid printed circuit board.

Figure 11:
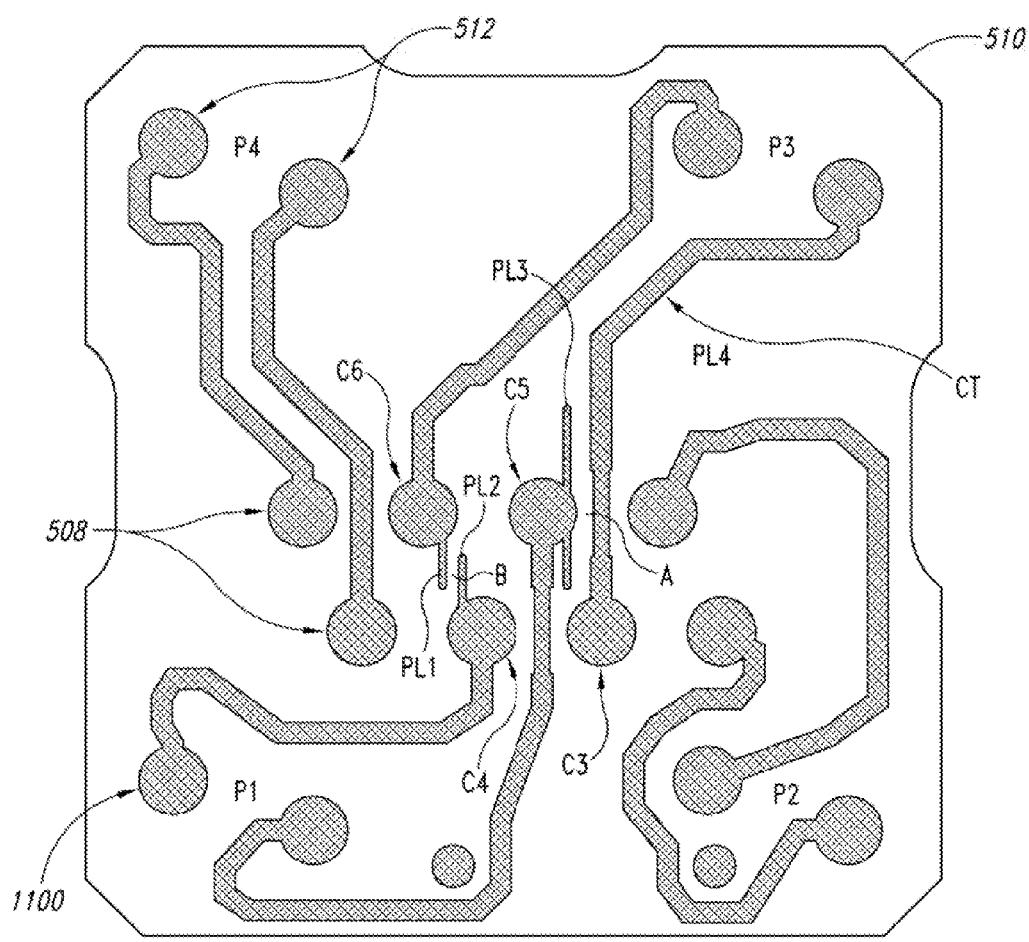
FIG. 11 is a layout of the rigid printed circuit board in the communications outlet of FIGS. 5 and 11 according to one embodiment of the present invention.

FIG. 11 is a layout of the rigid printed circuit board 510 in the communications outlet 500 of FIGS. 5 and 11 according to one embodiment of the present invention. The rigid printed circuit board 510 in FIG. 11 illustrates one embodiment for forming the conductive traces CT and positioning the through holes or vias 1100 for receiving the fixed ends 508 of the tines T and the IDCs 512. Only two vias 1100 are labeled in the figure merely to simplify the figure. Pairs of vias 1100 through which the IDCs 512 are inserted are positioned in the corners of the board 510, with the designation of the corresponding pair P1-P4 being shown adjacent to these pairs of vias in the figure. For example, in the upper left of the board 510 the IDCs 512 for pair P4 are to be inserted in the corresponding vias 1100.

The vias 1100 for the fixed ends 508 of the tines T are positioned in pairs as shown towards the center of the board and extending across the board from left to right. The capacitor B includes two conductive traces or plates PL1, PL2 extending from the vias 1100 as shown. In the figure, these vias 1100 are labeled with the corresponding contact C1-C8 to better describe the board 510. So plate PL1 extends from a via 1100 labeled C6 and plate PL2 extends from the via labeled C4 to thereby form the capacitor B illustrated in FIG. 10. Similarly, a single plate PL3 extends from the via 1100 labeled C5 and the conductive trace CT adjacent to this plate is labeled PL4 that is connected to the via labeled C3. In this way, these two plates P3 and P4 form the capacitor A illustrated in FIG. 10.

Figure 12:
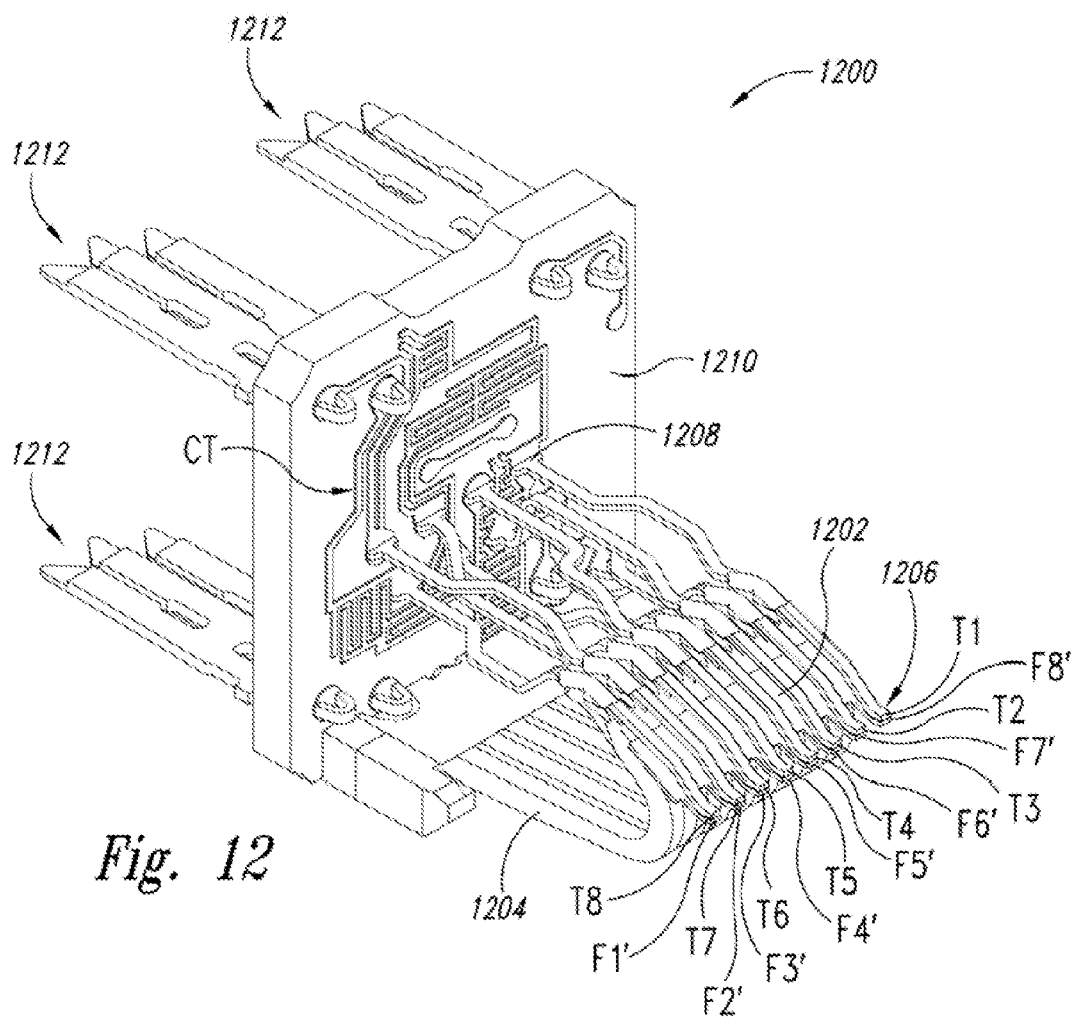
FIG. 12 is a perspective view of a communications outlet including a flexible printed circuit board having conductive fingers for attaching the board to all the resilient conductive outlet tines of the outlet according to another embodiment of the present invention.
Figure 13:
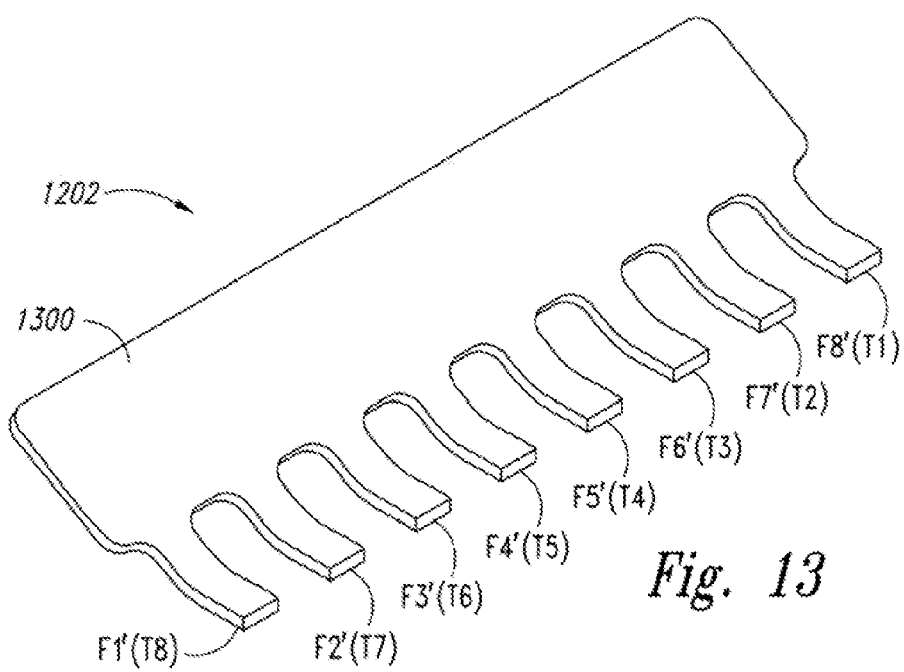
FIG. 13 is a perspective view illustrating in more detail the flexible printed circuit board of FIG. 12 according to one embodiment of the present invention.

FIG. 12 is a perspective view of a communications outlet 1200 including a flexible printed circuit board 1202 having eight conductive fingers F1'-F8' for attaching capacitive components (not shown) on the board to all the resilient conductive outlet tines T of the outlet according to another embodiment of the present invention. The components 1204-1212 are the same as corresponding components 504-512 in the outlet 500 of FIG. 5 and thus, for the sake of brevity, will not again be described in detail. FIG. 13 is a perspective view illustrating in more detail the flexible printed circuit board 1202 of FIG. 12 according to one embodiment of the present invention. The flexible printed circuit board 1202 includes a circuit portion 1300 on which capacitive components (not shown) are formed to provide the desired positive compensation. The board 1202 further includes the eight conductive fingers F1'-F8' that are attached to the tines T8-T1, respectively, with the tine to which each conductive finger is attached being indicated in parentheses next to the descriptor for the conductor (e.g., F1' is connected to tine T8). Suitable conductive traces (not shown) formed on the circuit portion 1300 interconnect the conductive fingers F' to the capacitive components (not shown) formed on the circuit portion and thereby interconnect the capacitive components to the desired tines T.

Figure 14:
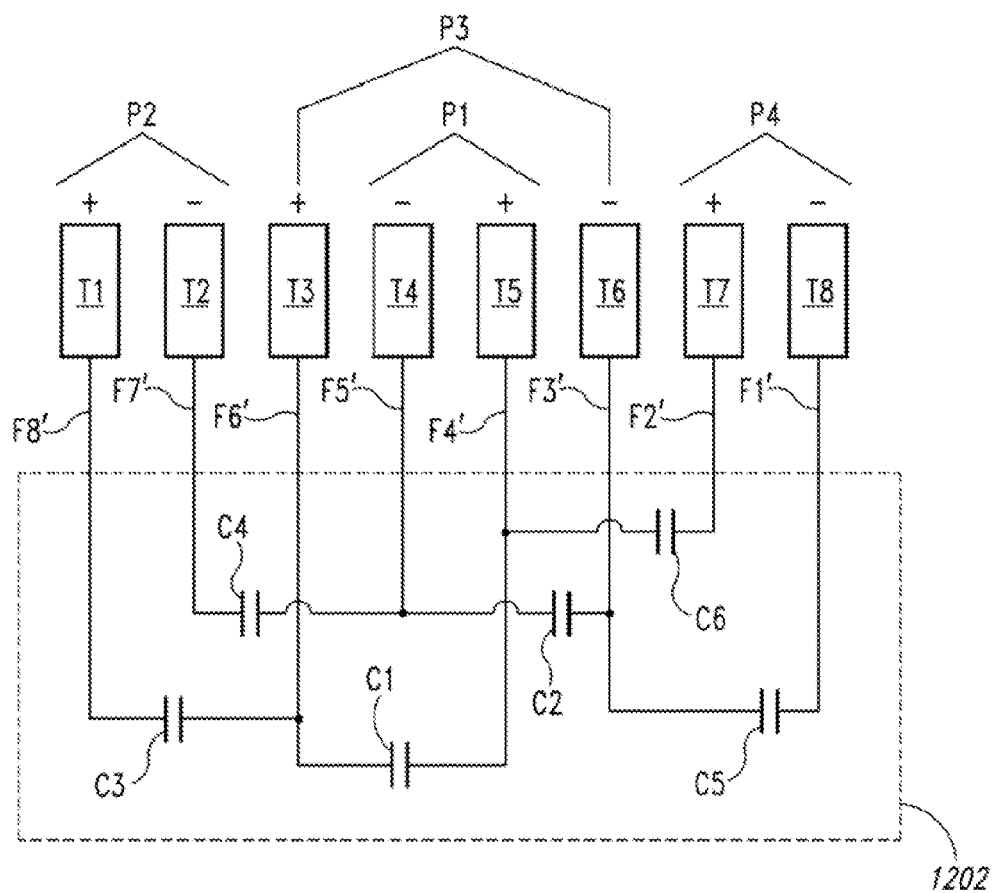
FIG. 14 is a schematic of the flexible printed circuit board of FIG. 13 according to one embodiment of the present invention.
Figure 5:
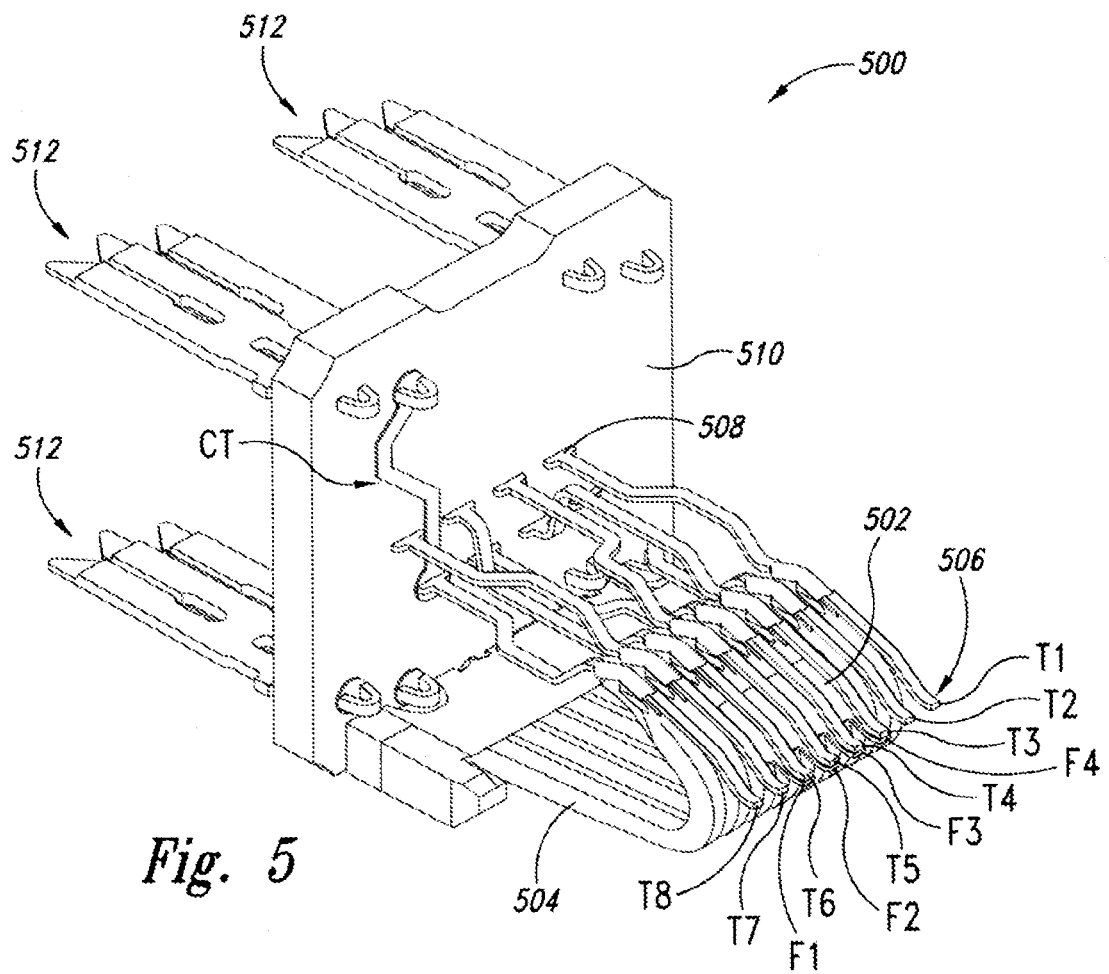
Figure 6:
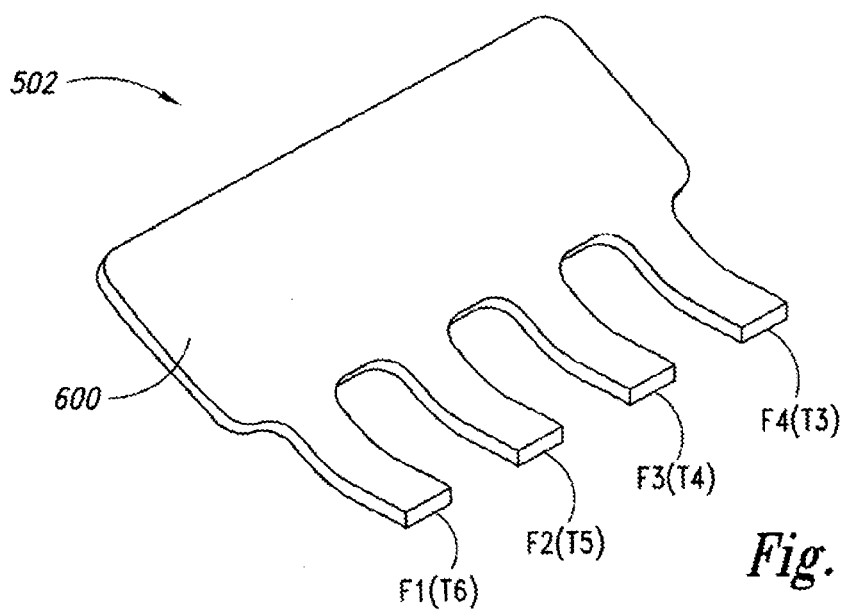
Figure 12:
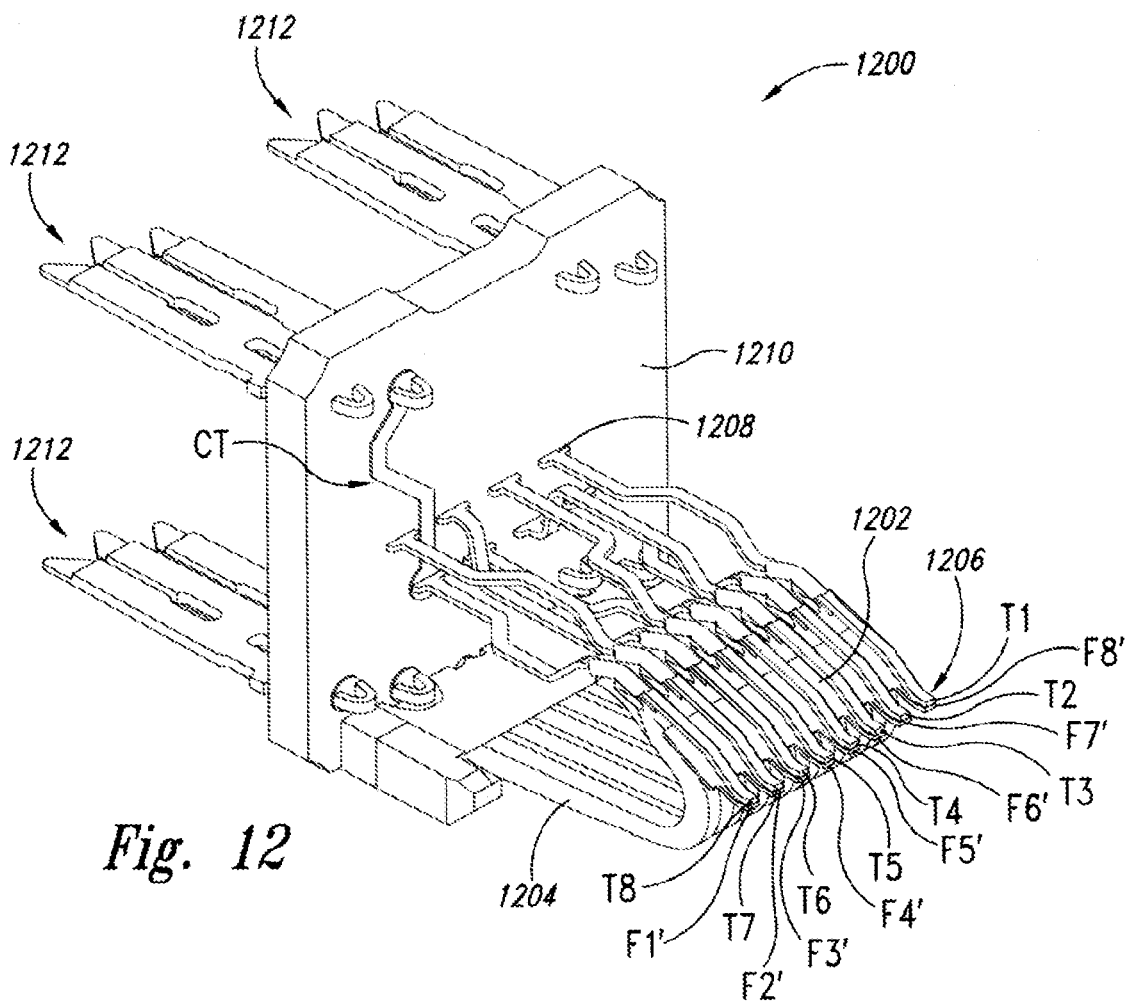
Figure 13:
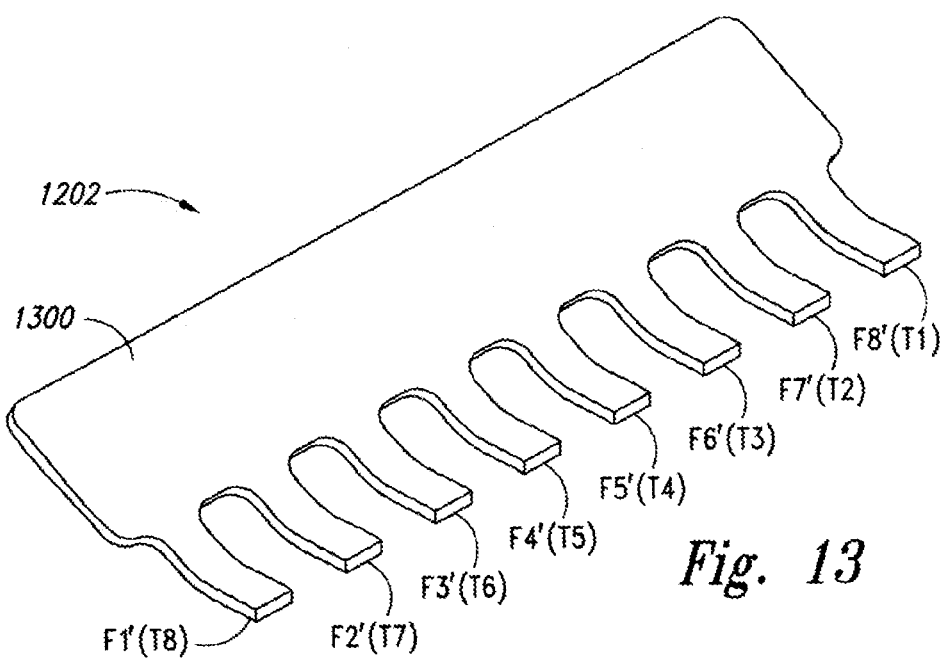

FIG. 14 is a schematic of the flexible printed circuit board 1202 of FIG. 13 according to one embodiment of the present invention. FIG. 14 is a schematic illustrating capacitive components C1-C6 formed on the flexible printed circuit board 1202. The capacitive component C1 is connected between finger F3' and finger F5' of the board 1202 and thus between tines T3 and T5. Similarly, the capacitive component C2 is connected between fingers F5' and F3' of the board 1202 and is thereby connected between tines T4 and T6. The capacitive components C3, C4, C5, and C6 are similarly connected between fingers (F8', F6'), (F7', F5'), (F1', F3'), and (F2', F4'), respectively, as shown. As did the capacitive components C1 and C2 on the flexible printed circuit board 502 of FIG. 5, all the capacitive components C1-C6 of the flexible printed circuit board 1202 provide positive compensation to reduce internal crosstalk between all pairs P1-P4 in the outlet 1300. This provides improved internal crosstalk performance for the outlet 1200 since internal crosstalk on all pairs P1-P4 is reduced via the compensation on the flexible printed circuit board 1202, instead of just pairs P1 and P3 as in the embodiment of the board 502 of FIGS. 5-9.

Figure 1:
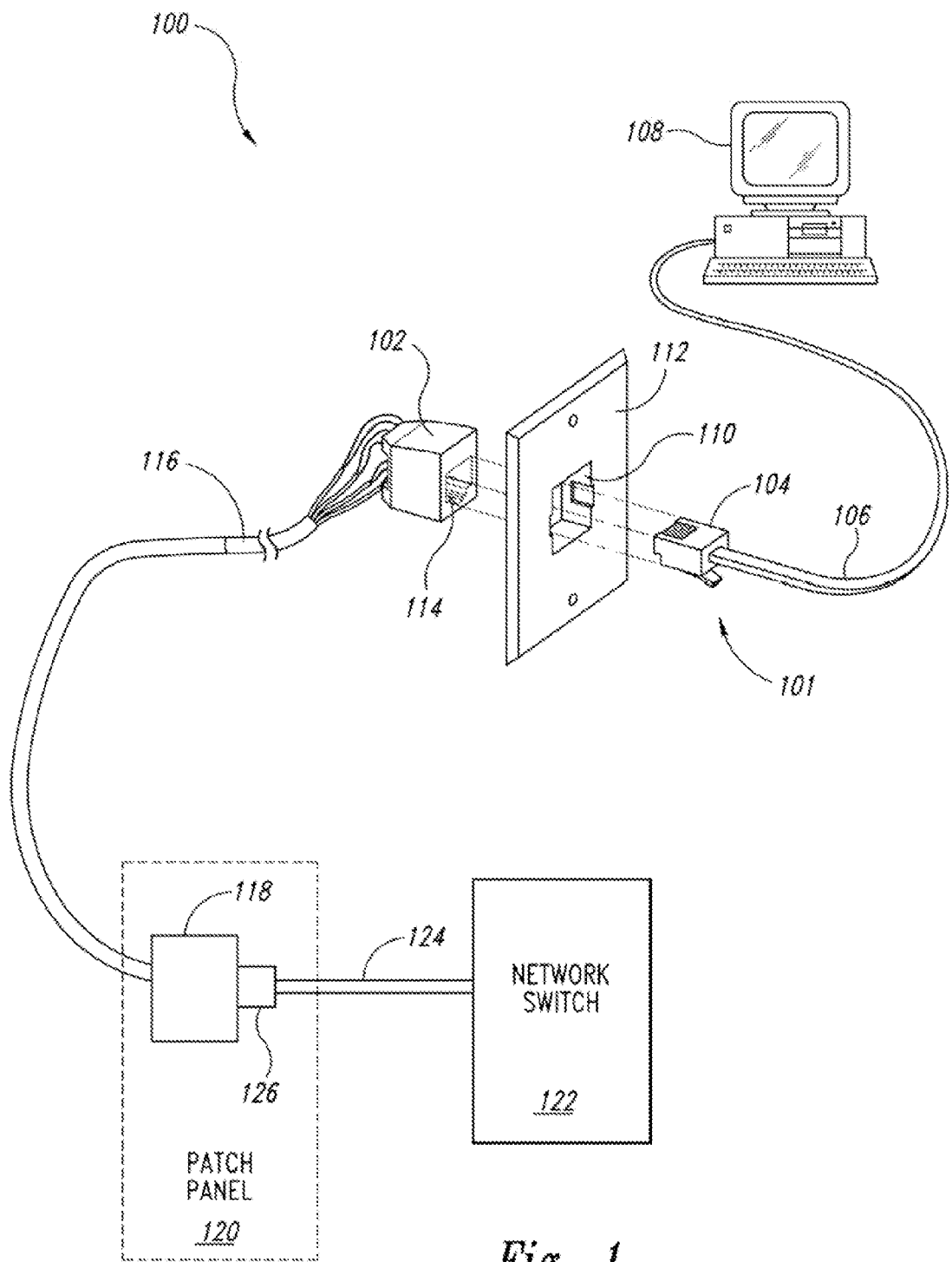
FIG. 1 is a diagram illustrating a portion of a conventional communications network including a typical communications channel containing communications outlets used in interconnecting components of the channel.
Figure 2:
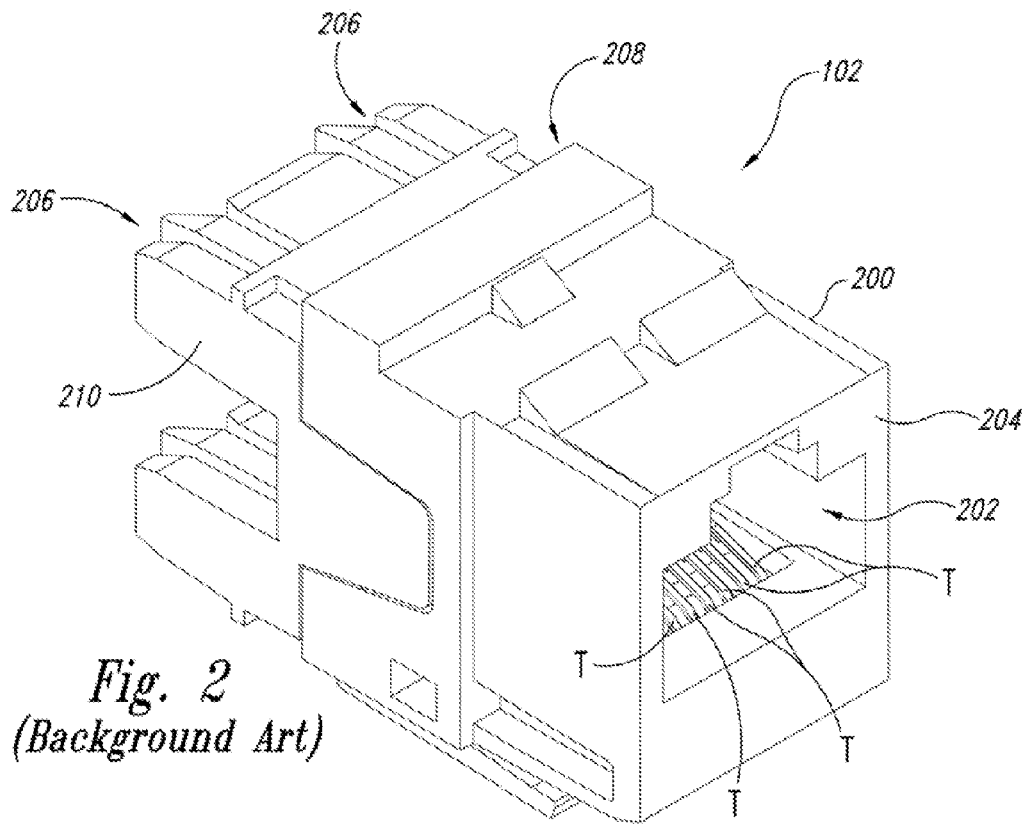
FIG. 2 is a more detailed perspective view of the communications outlet of FIG. 1.
Figure 3:
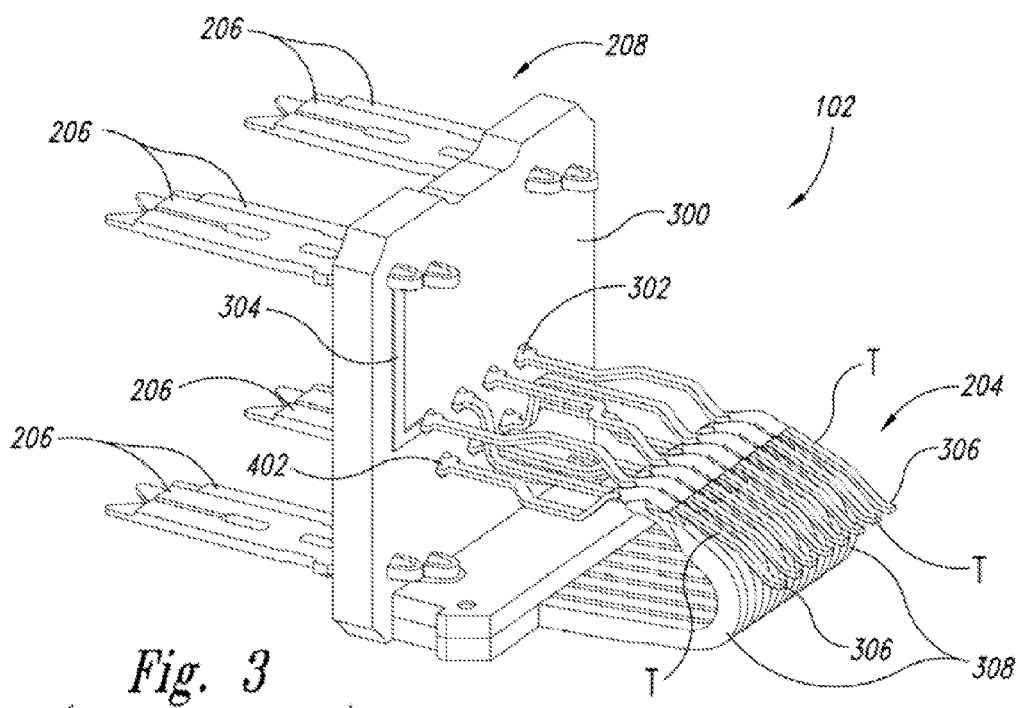
FIG. 3 is a perspective view of the communications outlet of FIG. 2 with the body removed to better illustrate the resilient conductive outlet tines and other components within the outlet.

Communications outlets 500 and 1200 and all embodiments of these outlets described with reference to FIGS. 5-14 are included in an electronic system, such as the communications network 100 of FIG. 1, according to another embodiment of the present invention.

Even though various embodiments and advantages of the present invention have been set forth in the foregoing description, the above disclosure is illustrative only, and changes may be made in detail and yet remain within the broad principles of the present invention. Therefore, the present invention is to be limited only by the appended claims.

What is claimed is:

1. A communications outlet including eight outlet tines positioned adjacent to one another and defining four pairs of outlet tines, the fourth and fifth outlet tines defining a first pair, the first and second outlet tines defining a second pair, the third and sixth outlet tines defining a third pair, and the seventh and eighth outlet tines defining a fourth pair, each outlet tine having a free end near which a plug tine is adapted to contact the outlet tine and each outlet tine having a fixed end coupled through a corresponding conductive tine to a corresponding electrical contact, the communications outlet comprising a first internal crosstalk compensation stage having a plurality of conductive fingers, each conductive finger being physically connected to a corresponding one of the outlet tines proximate the free ends of the tines, the first internal crosstalk compensation stage operable to provide positive compensation for internal crosstalk between pairs corresponding to the tines to which the conductive fingers of a flexible printed circuit board are connected.

2. The communications outlet of claim 1 wherein each of the conductive fingers of the flexible printed circuit board is physically connected to the corresponding tine by being soldered to that tine.

3. The communications outlet of claim 1 wherein the flexible printed circuit board includes a plurality of capacitive components formed on the flexible printed circuit board and connected through the conductive fingers to the conductive tines.

4. The communications outlet of claim 3 wherein the flexible printed circuit board comprises:
   four conductive fingers coupled respectively to outlet tines three through six;
   a first capacitive component connected between the third and fifth outlet tines; and
   a second capacitive component connected between the fourth and sixth outlet tines.

5. The communications outlet of claim 3 further comprising a second internal crosstalk compensation stage formed on the rigid printed circuit board proximate the fixed ends of the tines, the second internal crosstalk compensation stage operable to provide positive compensation for internal crosstalk between the same pairs of tines to which the conductive fingers of the flexible printed circuit board are connected.

6. The communications outlet of claim 5 wherein the second internal crosstalk compensation stage comprises:
   a third capacitive component connected between the third and fifth outlet tines; and
   a fourth capacitive component connected between the fourth and sixth outlet tines.

7. The communications outlet of claim 6 wherein the third and fourth capacitive components are formed via conductive traces formed on the rigid printed circuit board.

8. The communications outlet of claim 1 further comprising nonconductive and resilient spring arms that function to support the tines, the flexible printed circuit board being attached underneath the tines and above the spring arms.

9. The communications outlet of claim 1 further comprising a crossover region in which the tines of the first, second, and fourth pairs cross over another between the free and fixed ends of the tines.

10. The communications outlet of claim 3 wherein the flexible printed circuit board comprises:
   eight conductive fingers coupled respectively to outlet tines one through eight;
   a first capacitive component electrically connected between the third and fifth outlet tines;
   a second capacitive component electrically connected between the fourth and sixth outlet tines;
   a third capacitive component electrically connected between the first and third outlet tines;
   a fourth capacitive component electrically connected between the second and fourth outlet tines;

a fifth capacitive component electrically connected between the sixth and eighth outlet tines; and a sixth capacitive component electrically connected between the fifth and seventh outlet tines.

11. The communications outlet of claim 10 wherein each of the capacitive components comprises a capacitor including first and second conductive plates, the first conductive plate being larger than the second conductive plate.

12. The communications outlet of claim 1 wherein each of the electrical contacts comprises an insulation displacement connector.

13. An electronic system, comprising:

a first electronic subsystem;

a communication cable coupled to the first electronic subsystem and including a communications plug;

a communications outlet adapted to receive the communications plug, the communications outlet including eight outlet tines positioned adjacent to one another and defining four pairs of outlet tines, the fourth and fifth outlet tines defining a first pair, the first and second outlet tines defining a second pair, the third and sixth outlet tines defining a third pair, and the seventh and eighth outlet tines defining a fourth pair, each outlet tine having a free end near which a plug tine is adapted to contact the outlet tine and each outlet tine having a fixed end coupled through a corresponding conductive tine to a corresponding electrical contact, the communications outlet comprising a first internal crosstalk compensation stage having a plurality of conductive fingers, each conductive finger being physically connected to a corresponding one of the outlet tines proximate the free ends of the tines, the first internal crosstalk compensation stage operable to provide positive compensation for internal crosstalk between pairs corresponding to the tines to which the conductive fingers of a flexible printed circuit board are connected;

a second communications cable coupled to the electrical contacts of the communications outlets; and a second electronic subsystem coupled to the second plurality of communication cables.

14. The electronic system of claim 13 wherein the first electronic subsystem comprises a computer system and the second electronic subsystem comprises a network switch.

15. The electronic system of claim 13 wherein the communications outlet meets the requirements of the CAT6 and CAT6A standards.

16. The electronic system of claim 13 wherein the electronic system comprises a communications network.

17. A method of reducing internal crosstalk in a communications outlet, the communications outlet including at least eight conductive outlet tines forming four pairs of outlet tines with one of the pairs of outlet tines being a split pair and the pair of tines located between the split pair being designated the first pair, each of the tines having a free end and a fixed end and the method comprising:

proximate the free ends of the tines,
  introducing first positive compensation between the first pair and the split pair; and
  introducing second positive compensation between the first pair and the split pair, the second positive compensation being time delayed relative to the first positive compensation.

18. The method of claim 17 wherein the second positive compensation is introduced proximate the fixed ends of the tines.

19. The method of claim 17 wherein introducing positive compensation between the conductors of the first pair and the split pair comprises providing capacitive coupling between the conductive outlet tines of these pairs.

20. The method of claim 17 further comprising, proximate the free ends of the tines, introducing positive compensation among the remaining pairs of conductive outlet tines.

* * * * *

UNITED STATES PATENT AND TRADEMARK OFFICE
CERTIFICATE OF CORRECTION

Page 1 of 4

PATENT NO. : 7,824,231 B2
APPLICATION NO. : 12/234597
DATED : November 2, 2010
INVENTOR(S) : Franklin C. Marti et al.

It is certified that error appears in the above-identified patent and that said Letters Patent is hereby corrected as shown below:

Delete Title Page, and substitute with new Title Page. (Attached)

Delete Drawing Sheet 4, and replace with Drawing Sheet 4. (Attached)
- In the drawings, Sheet 4, Fig. 5, the layout of the printed circuit board, which has no effect on the content of Fig. 5, is hereby removed to bring the Figure into better conformity with the specification.

Delete Drawing Sheet 9, and replace with Drawing Sheet 9. (Attached)
- In the drawings, Sheet 9, Fig. 12, the layout of the printed circuit board, which has no effect on the content of Fig. 12, is hereby removed to bring the Figure into better conformity with the specification.

Signed and Sealed this
Twenty-eighth Day of June, 2011

David J. Kappos
*Director of the United States Patent and Trademark Office*

(12) United States Patent
Marti et al.

(10) Patent No.: US 7,824,231 B2
(45) Date of Patent: Nov. 2, 2010

(54) INTERNAL CROSSTALK COMPENSATION CIRCUIT FORMED ON A FLEXIBLE PRINTED CIRCUIT BOARD POSITIONED WITHIN A COMMUNICATIONS OUTLET, AND METHODS AND SYSTEM RELATING TO SAME

(75) Inventors: Franklin C. Marti, Clinton, WA (US); Jason Erickson, Bothell, WA (US); Jeffrey P. Seefried, Lake Stevens, WA (US)

(73) Assignee: Leviton Manufacturing Co., Inc., Melville, NY (US)

(*) Notice: Subject to any disclaimer, the term of this patent is extended or adjusted under 35 U.S.C. 154(b) by 190 days.

(21) Appl. No.: 12/234,597

(22) Filed: Sep. 19, 2008

(65) Prior Publication Data
US 2009/0104821 A1 Apr. 23, 2009

Related U.S. Application Data

(60) Provisional application No. 60/973,675, filed on Sep. 19, 2007.

(51) Int. Cl.
*H01R 24/00* (2006.01)
(52) U.S. Cl. ...................................... 439/676; 439/949
(58) Field of Classification Search ............... 439/676, 439/949
See application file for complete search history.

(56) References Cited

U.S. PATENT DOCUMENTS

| | | |
|---|---|---|
| 5,186,647 A | 2/1993 | Denkmann et al. |
| 5,299,956 A | 4/1994 | Brownell et al. |
| 5,791,943 A | 8/1998 | Lo et al. |
| 6,083,052 A | 7/2000 | Adams et al. |
| 6,139,371 A | 10/2000 | Troutman et al. |

(Continued)

FOREIGN PATENT DOCUMENTS

JP 2000113941 A 4/2000

(Continued)

OTHER PUBLICATIONS

U.S. Appl. No. 12/604,207, filed Oct. 22, 2009, Applicants: Franklin C. Marti et al.

(Continued)

*Primary Examiner*—James Harvey
(74) *Attorney, Agent, or Firm*—Kathryn M. Milam; Paul F. Rusyn; Graybeal Jackson LLP

(57) ABSTRACT

A communications outlet includes eight outlet tines positioned adjacent to one another and define four pairs of outlet tines. The fourth and fifth outlet tines define a first pair, the first and second outlet tines define a second pair, the third and sixth outlet tines define a third pair, and the seventh and eighth outlet tines define a fourth pair. Each outlet tine has a free end near which a plug tine is adapted to contact the outlet tine and each outlet tine has a fixed end coupled through a corresponding conductive tine to a corresponding electrical contact. The communications outlet includes an internal crosstalk compensation stage having a plurality of conductive fingers. Each conductive finger is physically connected to a corresponding one of the outlet tines proximate the free ends of the tines. The internal crosstalk compensation stage is operable to provide positive compensation for internal crosstalk between pairs corresponding to the tines to which the conductive fingers of the flexible printed circuit board are attached.

20 Claims, 10 Drawing Sheets

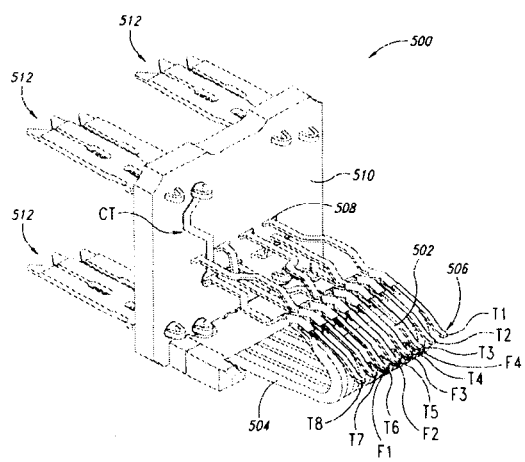

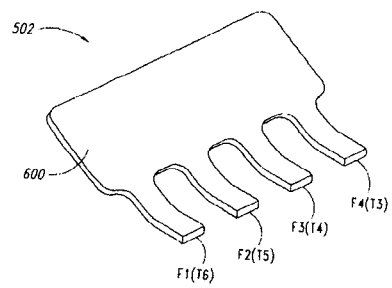

UNITED STATES PATENT AND TRADEMARK OFFICE
CERTIFICATE OF CORRECTION

| | | |
|---|---|---|
| PATENT NO. | : 7,824,231 B2 | |
| APPLICATION NO. | : 12/234597 | |
| DATED | : November 2, 2010 | |
| INVENTOR(S) | : Franklin C. Marti et al. | |

It is certified that error appears in the above-identified patent and that said Letters Patent is hereby corrected as shown below:

Claim 1, Column 10, Line 5, "line" should read --trace--.

Claim 3, Column 10, Line 22, "conductive tines." should read --tines.--.

Claim 5, Column 10, Line 34, "the rigid" should read --a rigid--.

Claim 13, Column 11, Line 27, "tine" should read --trace--.

Signed and Sealed this
Thirty-first Day of July, 2012

David J. Kappos
*Director of the United States Patent and Trademark Office*